United States Patent [19]
Ikeda

[11] Patent Number: 5,911,326
[45] Date of Patent: Jun. 15, 1999

[54] TRAY FOR VISUAL INSPECTION OF SEMICONDUCTOR WAFER

[75] Inventor: Hiroshi Ikeda, Kanagawa, Japan

[73] Assignee: Komatsu Electronic Metals Co., Ltd., Kanagawa, Japan

[21] Appl. No.: 08/966,980

[22] Filed: Nov. 10, 1997

[30] Foreign Application Priority Data

Nov. 9, 1996 [JP] Japan ................... 8-332638

[51] Int. Cl.$^6$ .................................. B65D 85/00

[52] U.S. Cl. .............. 206/710; 206/308.1; 206/769; 206/564; 206/701

[58] Field of Search .................. 206/710, 711, 206/736, 769, 216, 308.1, 701, 706, 445, 564; 211/41.18, 41.2

[56] References Cited

U.S. PATENT DOCUMENTS 5,487,398  1/1996  Ohmi et al. .................. 134/95.1

*Primary Examiner*—S. Thomas Hughes
*Assistant Examiner*—Jermie E. Cozart
*Attorney, Agent, or Firm*—Sughrue, Mion, Zinn, Macpeak & Seas, PLLC

[57] ABSTRACT

The object of the present invention is to provide a tray for inspecting the surfaces of semiconductor wafers, which can enhance the success at visually identifying flaws on the edge of the semiconductor wafer and can reduce the irregular reflection occurring in the tray. According to this invention, the tray for inspecting the surfaces of semiconductor wafers of this invention includes a panel-shaped tray body 1; and a support frame 3 installed on the surface of the tray body vertically, capable of loading a semiconductor wafer 5 in a manner elevated from and parallel with the tray body 1.

7 Claims, 5 Drawing Sheets

TRAY FOR VISUAL INSPECTION OF SEMICONDUCTOR WAFER

BACKGROUND OF THE INVENTION

1. Field of the Invention

This invention relates to a fixture used for visual inspection of semiconductor wafers.

2. Description of the Related Art

In the final surface inspection of the end product of semiconductor wafers, very bright light coming from a high-intensify lamp is shone on semiconductor wafers, and inspection for flakes or chipping is performed visually. On this occasion, a tray as shown in FIG. 5 is used for loading semiconductor wafers, and inspection is carried out by manually adjusting the inclined angle of the tray. In conventional cases, wafers. are fitted into and affixed to the recesses forced in the tray.

However, in conventional cases, semiconductor wafers enter the recesses, therefore it is difficult to detect flaws (such as flakes, chips, or cracks) on the edge of the semiconductor wafer by visual inspection. In the case that the light intensity is increased to overcome the above problem, irregular reflection occurs in the tray, and the outcome of visual identification is diversely affected.

SUMMARY OF THE INVENTION

In view of the above defects, the object of the present invention is to provide a tray for inspecting the surfaces of semiconductor wafers, which can enhance the outcome of visual identification of flaws on the edge of the semiconductor wafer and can reduce the irregular reflection occurred in the tray.

To achieve the above object, the major feature of the tray for inspecting the surfaces of semiconductor wafers of this invention is that it comprises a tray body; and a support frame arisen from a surface of the tray body and capable of loading a semiconductor wafer in a manner elevated from and parallel with the tray body.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
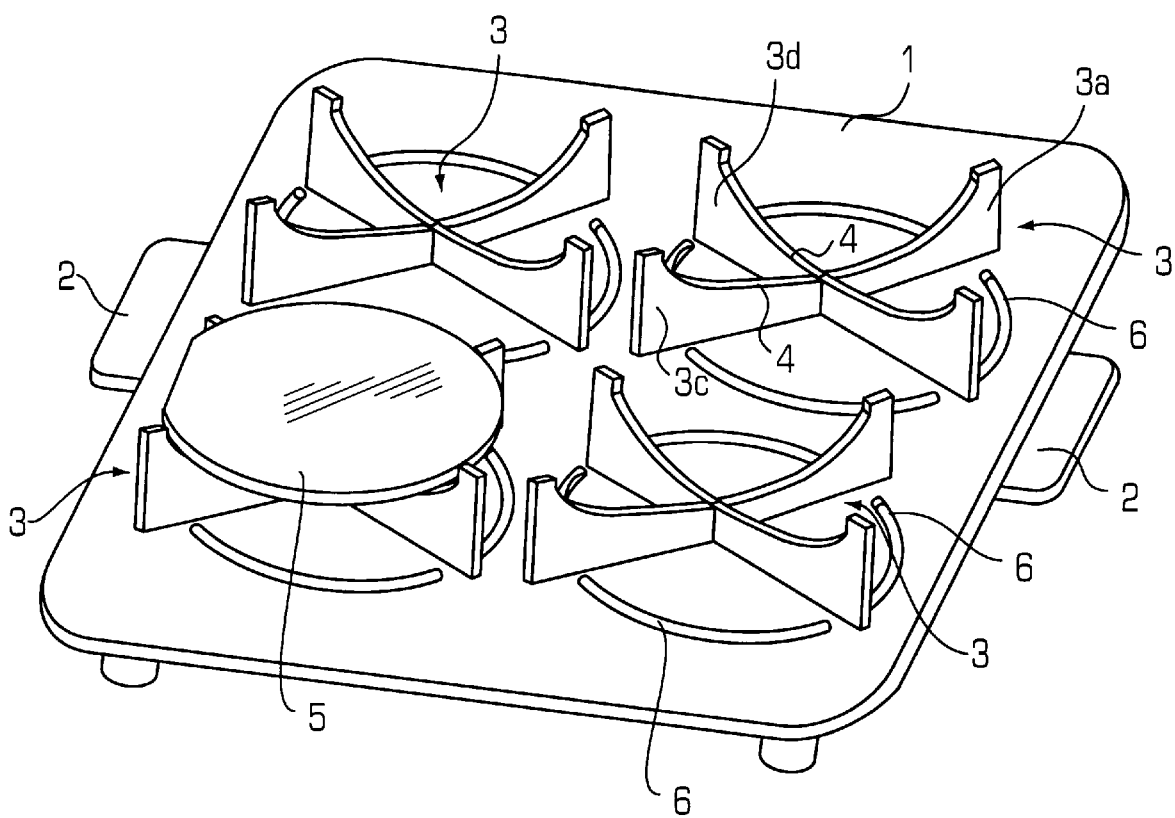
FIG. 1 is a perspective view of the tray for inspecting the surfaces of semiconductors.
Figure 2:
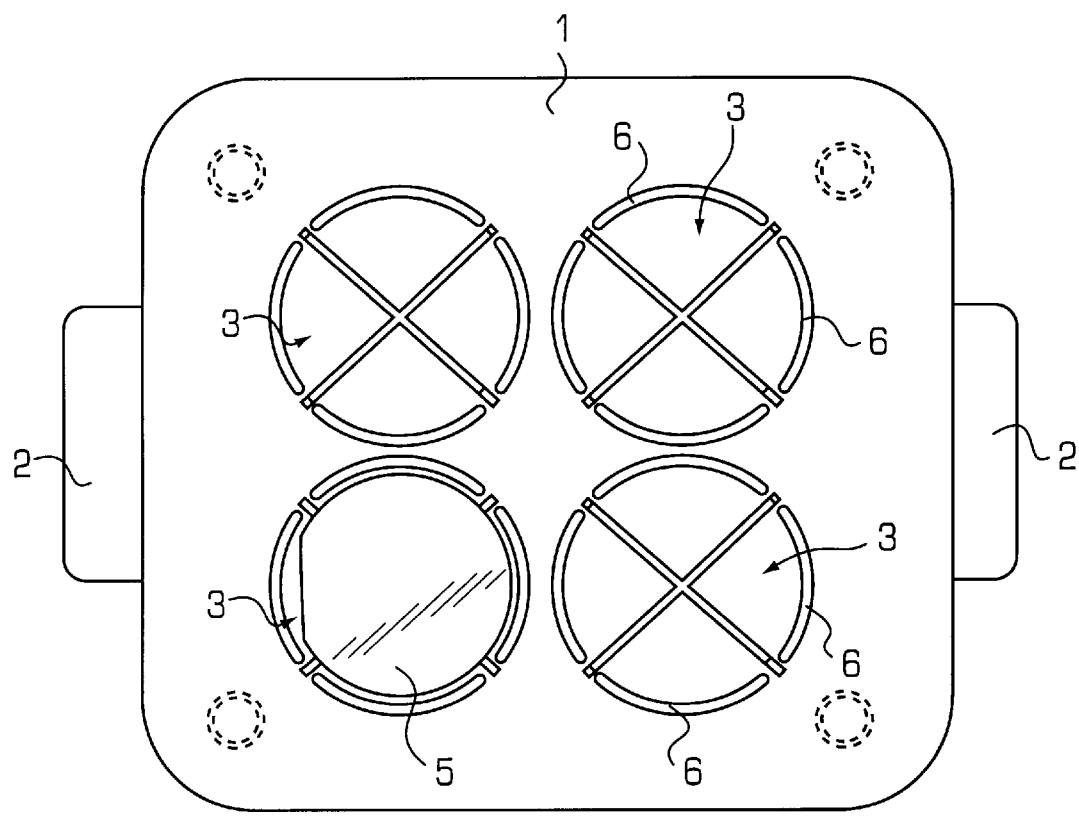
FIG. 2 is a top view of the tray for inspecting the surfaces of semiconductor wafers according to this invention.
Figure 3:
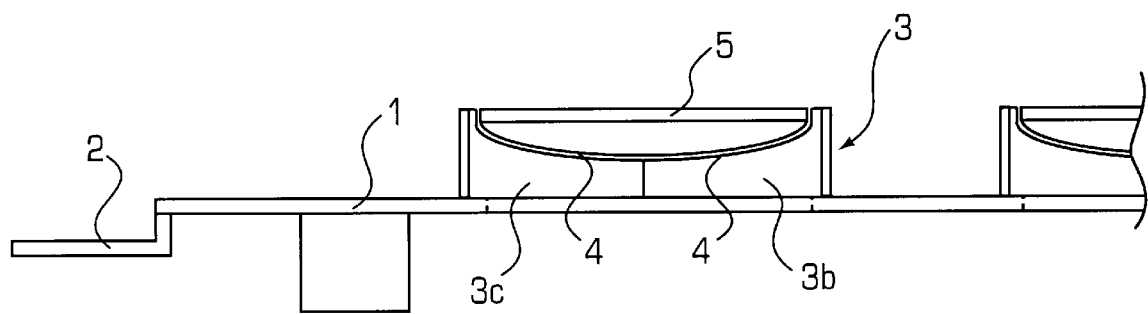
FIG. 3 is a partially enlarged side view showing a semiconductor wafer loaded on the tray for inspection of its surfaces of semiconductor wafers according to this invention.
Figure 4A:
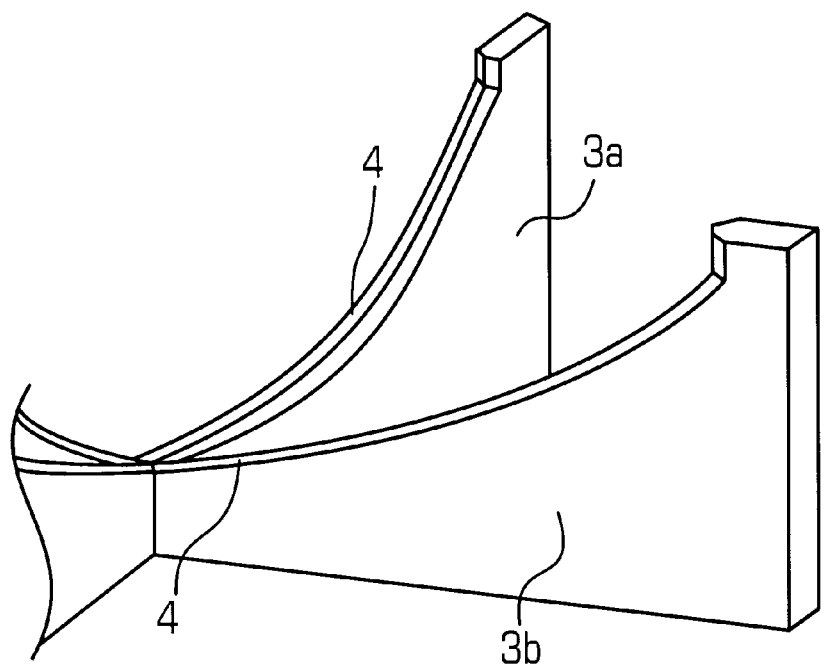
FIG. 4a is a perspective view showing the shape of the edge portion of wafer plates.
Figure 4B:
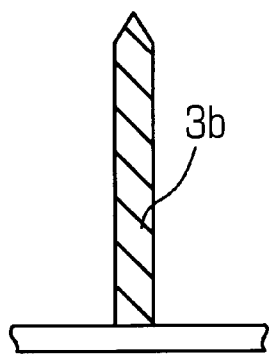
FIG. 4b is a cross-sectional view showing the shape of the edge portion of a wafer plate.
Figure 5:
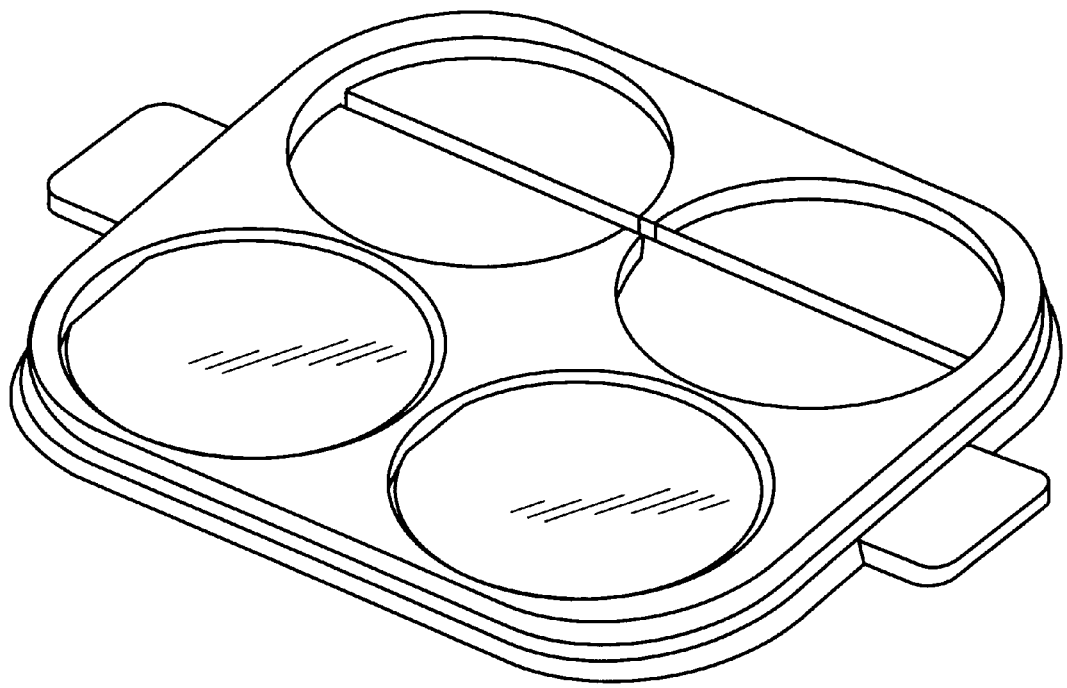
FIG. 5 is a perspective view of a prior art.

FIG. 1 is a perspective view of the tray for inspecting the surfaces of semiconductor wafers according to this invention. FIG. 2 is a top view of the tray for inspecting the surfaces of semiconductor wafers according to this invention. FIG. 3 is a partially enlarged side view showing a semiconductor wafer loaded on the tray for inspection of surfaces of semiconductor wafers according to this invention. FIG. 4a is a perspective view showing the shape of the edge portion of a wafer plate. FIG. 4b is a cross-sectional view showing the shape of the edge portion of a wafer plate. FIG. 5 is a perspective view of a prior art.

As shown in FIGS. 1 to 3, numeral 1 denotes the tray body made of synthetic resin and shaped like a rectangular plate whose corners are chamfered to arcs, wherein one pair of handles 2 extending outward are formed on two opposite lateral sides thereof. The tray body 1 has a dark color, and it is preferable to minimize the reflection of its surface to enhance visual identification. There are four support frames 3 installed on the surface of the tray body 1, used for loading semiconductor wafers. Each support frame 3 consists of four wafer support plates 3a, 3b, 3c, 3d, and each wafer support plate is arranged to extend in the radial direction of the semiconductor wafer 5 to be loaded thereon. The four wafer support plates 3a, 3b, 3c, 3d are vertically installed on the surface of the tray body 1 in a manner wherein each is perpendicular to its neighbor.

Each of the four wafer support plates 3a, 3b, 3c, 3d has an arc portion 4 which makes the height of each wafer support plate gradually decrease in the direction approaching the center of the semiconductor wafer loaded thereon. By such an arrangement, a semiconductor wafer can be loaded in a manner elevated from and parallel with the tray body 1. Furthermore, as shown in FIG. 4, the edges of the arc portions 4 of the four wafer support plates 3a, 3b, 3c, 3d are knife-edge shaped, and the four wafer support plates 3a, 3b, 3c, 3d are kept in contact with the semiconductor wafer 5 loaded thereon by way of tiny points.

In addition, there is a plurality of communicating windows 6 formed in the tray body 1, the locations of the communicating windows 6 are in line with the edges of the semiconductor wafers 5, so that light emitted from the high-intensify lamp will pass through the communicating windows 6.

The following is a description of the function of this embodiment.

In the case of the conventional tray shown in FIG. 5, semiconductor wafers are accommodated within the recesses of the tray. Therefore, semiconductor wafers are subject to a state of irregular reflection, due to intensifying light brightness which causes reflections from the tray. Thus, part of the normal reflection image of the semiconductor wafer is subject to interference by the irregular reflection and accordingly is difficult to assess. This constitutes an obstruction to visual inspection. However, according to this invention, by using the support frames 3, the edges of the semiconductor wafers 5 are elevated and become visible, therefore it goes without saying that visual identification of the edges can be enhanced. Furthermore, due to the fact that the semiconductor wafers 5 are elevated from the tray body 1, the semiconductor wafers 5 are disposed above the place where the irregular reflection emits from. Thus, the normal reflection image of the semiconductor wafer can be clearly identified and will not be interfered by the irregular reflection coming from the tray body 1.

Furthermore, light emitted from the high-intensified lamp is set to pass through the communicating windows 6, therefore irregular reflection coming from the edge of the loaded semiconductor wafer 5 can be reduced.

Furthermore, in this embodiment, the support frame 3 consists of four wafer support plates 3a, 3b, 3c, 3d.

However, it is not limited to this, three wafer support plates disposed in a radial manner can also satisfactorily be used to hold the semiconductor wafer 5.

The structure of the tray used for visual inspection of semiconductor wafers as disclosed above attains the following effects.

(1) Semiconductor wafers are loaded at a place elevated from the tray body 1, therefore the visual identification of flaws on the edge of the semiconductor wafers can be enhanced and the irregular reflection from the tray can be reduced.

(2) The support frame and the semiconductor wafer are kept in contact at tiny points, thus contamination of semiconductor wafers resulting from their contact with the support frame can be avoided.

What is claimed is:

1. A tray for inspecting the surfaces of semiconductor wafers comprising:

a tray body; and a support frame arisen from a surface of the tray body, installed vertically on the surface of the tray body for loading a semiconductor wafer in a manner elevated from and parallel with the tray body, wherein the support frame includes at least three wafer support plates, disposed along the radii of the semiconductor loaded thereon.

2. The tray for inspecting the surfaces of semiconductor wafers as claimed in claim 1, wherein the tray body has a plate shape.

3. The tray for inspecting the surfaces of semiconductor wafers as claimed in claim 1, wherein each of the wafer support plates is provided with an arc portion which makes the height of each wafer support plate gradually decrease in the direction approaching the center of the semiconductor wafer loaded thereon.

4. The tray for inspecting the surfaces of semiconductor wafers as claimed in claim 1, wherein the support frame includes four wafer support plates, each being arranged to extend along the radii of the semiconductor wafer loaded thereon and being perpendicular to its neighbor, and each of the wafer support plates is provided with an arc portion which makes the height of each wafer support plate gradually decrease in the direction approaching the center of the semiconductor wafer loaded thereon.

5. The tray for inspecting the surfaces of semiconductor wafers as claimed in claim 3, wherein the edges of the arc portions of the wafer support plates are knife-edge shaped.

6. The tray for inspecting the surfaces of semiconductor wafers as claimed in claim 4, wherein the edges of the arc portions of the wafer support plates are knife-edge shaped.

7. A tray for inspecting the surfaces of semiconductor wafers comprising: a tray body; and a support frame arisen from a surface of the tray body and capable of loading a semiconductor wafer in a manner elevated from and parallel with the tray body, wherein a communicating window is formed at a position in the tray body, corresponding to the edge of the semiconductor wafer to be loaded thereon, so as to pass emitted light therethrough.

\* \* \* \* \*